United States Patent
Cheng

(10) Patent No.: US 7,598,786 B2
(45) Date of Patent: Oct. 6, 2009

(54) DUTY CYCLE CORRECTION CIRCUIT AND METHOD THEREOF

(75) Inventor: Wen-Chang Cheng, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 16 days.

(21) Appl. No.: 11/925,338

(22) Filed: Oct. 26, 2007

(65) Prior Publication Data

US 2008/0290920 A1 Nov. 27, 2008

(30) Foreign Application Priority Data

May 24, 2007 (TW) .............................. 96118491 A

(51) Int. Cl.
*H03K 3/017* (2006.01)
(52) U.S. Cl. ...................... 327/175; 327/172; 327/173; 327/174
(58) Field of Classification Search ................. 327/172, 327/173, 174, 175
See application file for complete search history.

(56) References Cited

U.S. PATENT DOCUMENTS

| | | | | |
|---|---|---|---|---|
| 5,757,218 A * | 5/1998 | Blum | .......................... | 327/175 |
| 6,269,051 B1 * | 7/2001 | Funaba et al. | .......... | 365/233.11 |
| 6,703,879 B2 * | 3/2004 | Okuda et al. | ................. | 327/158 |
| 6,828,835 B2 * | 12/2004 | Cho | .......................... | 327/158 |
| 6,989,700 B2 * | 1/2006 | Kim | .......................... | 327/158 |

* cited by examiner

*Primary Examiner*—Kenneth B. Wells
(74) *Attorney, Agent, or Firm*—Quintero Law Office

(57) ABSTRACT

A duty cycle correction circuit comprises a frequency divider, a duty cycle detector and a delay circuit. The frequency divider receives a first clock signal and divides the frequency of the first clock signal to generate a second clock signal. The duty cycle detector receives the second clock signal and a correction clock signal and generates a control signal according to the second clock signal and the correction clock signal. The delay circuit receives the first clock signal and the control signal and adjusts a delay time of a falling edge of the first clock signal according to the control signal to generate the correction clock.

14 Claims, 5 Drawing Sheets

DUTY CYCLE CORRECTION CIRCUIT AND METHOD THEREOF

BACKGROUND OF THE INVENTION

1. Field of the Invention

The invention relates to a correction circuit, and in particular relates to a correction circuit with 50% duty cycle.

2. Description of the Related Art

In general, dynamic random access memory (DRAM) uses a receiver to receive complementary clock signals (VCLK and /VCLK) from an external circuit and generates a main clock signal (MCLK) for internal circuit use. However, due to device mismatch, temperature factor or other factors, the complementary clock signals (VCLK and /VCLK) can be mismatched. In this example, the main clock signal (MCLK) will be shifted and affect a clock signal margin of internal circuits.

BRIEF SUMMARY OF THE INVENTION

A detailed description is given in the following embodiments with reference to the accompanying drawings.

An embodiment of a duty cycle correction circuit is provided. The duty cycle correction circuit comprises a frequency divider, a duty cycle detector and a delay circuit. The frequency divider receives a first clock signal and divides the frequency of the first clock signal to generate a second clock signal. The duty cycle detector receives the second clock signal and a correction clock signal and generates a control signal according to the second clock signal and the correction clock signal. The delay circuit receives the first clock signal and the control signal and adjusts a delay time of a falling edge of the first clock signal according to the control signal to generate the correction clock.

Another embodiment of a duty cycle correction method is provided. The duty cycle correction method comprises dividing a frequency of a first clock signal to generate a second clock signal, charging a first terminal of a comparator by a first fixed current during a period of the first clock signal, charging a second terminal of the comparator by a second fixed current during the period of the first clock signal, comparing voltages of the first terminal and the second terminal of the comparator to generate a control signal, and adjusting a delay time of a falling edge of the first clock signal according to the control signal.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
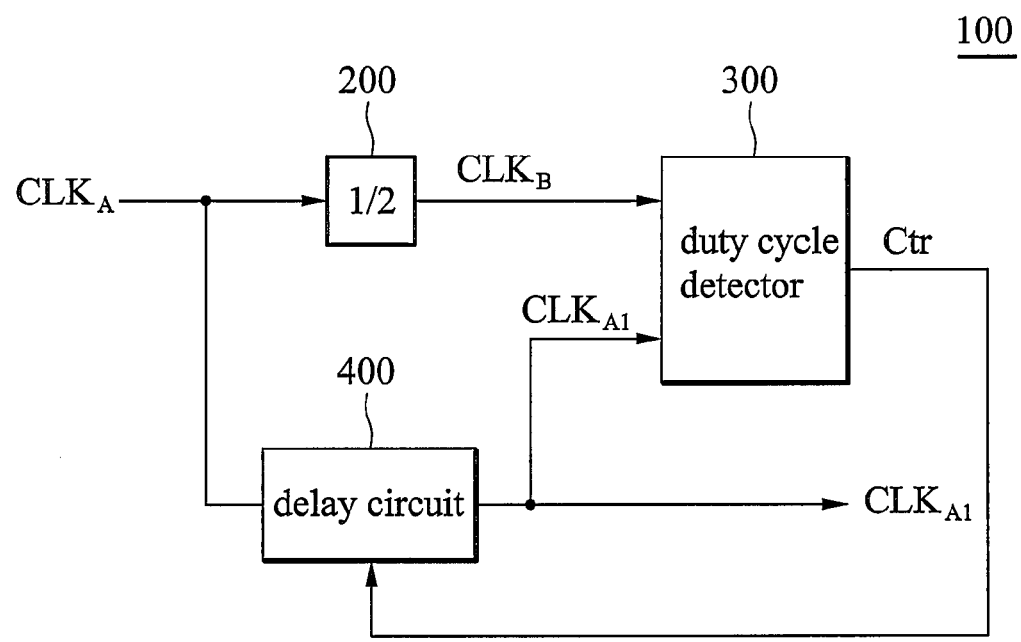
FIG. 1 is a schematic diagram of a duty cycle corrector according to an embodiment of the invention.

FIG. 1 is a schematic diagram of duty cycle corrector 100 according to an embodiment of the invention. Duty cycle corrector 100 can convert a clock signal without 50% duty cycle to a clock signal with 50% duty cycle. Duty cycle corrector 100 comprises frequency divider 200, duty cycle detector 300 and delay circuit 400. Frequency divider 200 receives clock signal $CLK_A$ and divides the frequency of clock signal $CLK_A$ by 2 to generate clock signal $CLK_B$ (the length of clock signal $CLK_B$ at a high voltage level equals to a cycle of clock signal $CLK_A$, the length of clock signal $CLK_B$ at a low voltage level equals to a cycle of clock signal $CLK_A$). Duty clock detector 300 receives clock signal $CLK_B$ and correction clock signal $CLK_{A1}$ to generate control signal Ctr. Delay circuit 400 receives clock signal $CLK_A$ and control signal Ctr and adjusts a delay time of a falling edge of clock signal $CLK_A$ according to control signal Ctr to generate correction clock signal $CLK_{A1}$.

When the duty cycle of clock signal $CLK_A$ is less than 50%, delay circuit 400 increases a delay time of a falling edge of clock signal $CLK_A$. When the duty cycle of clock signal $CLK_A$ is more than 50%, delay circuit 400 decreases a delay time of a falling edge of clock signal $CLK_A$. After correction by duty cycle corrector 100, correction clock signal $CLK_{A1}$ is a clock signal with 50% duty cycle.

Figure 2:
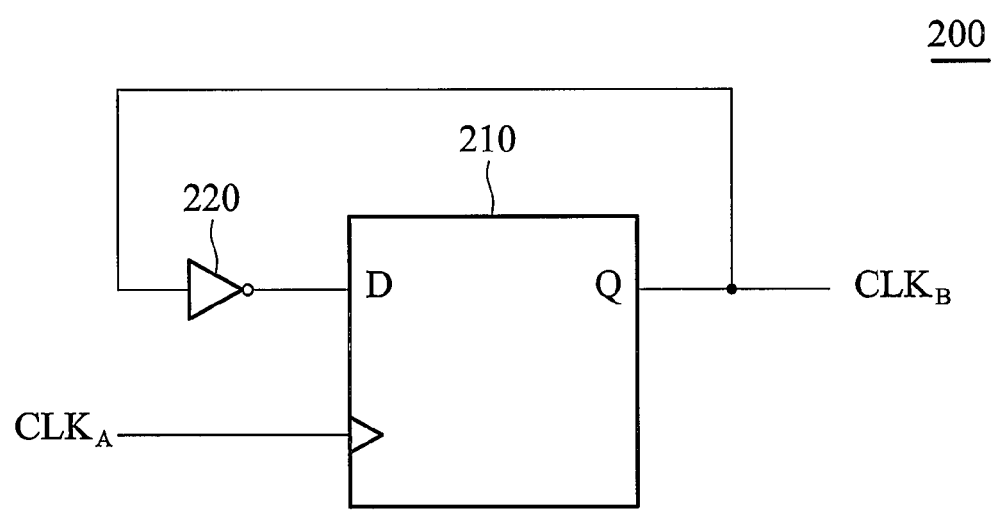
FIG. 2 is a schematic diagram of a frequency divider according to an embodiment of the invention.

FIG. 2 is a schematic diagram of frequency divider 200 according to an embodiment of the invention. Frequency divider 200 comprises flip flop 210 and inverter 220. Flip flop 210 receives clock signal $CLK_A$ to generate clock signal $CLK_B$. Inverter 220 is coupled between clock signal $CLK_B$ and flip flop 210, as shown in FIG. 2. Frequency divider 200 generates clock signal $CLK_B$ according to a rising edge of clock signal $CLK_A$.

Figure 3:
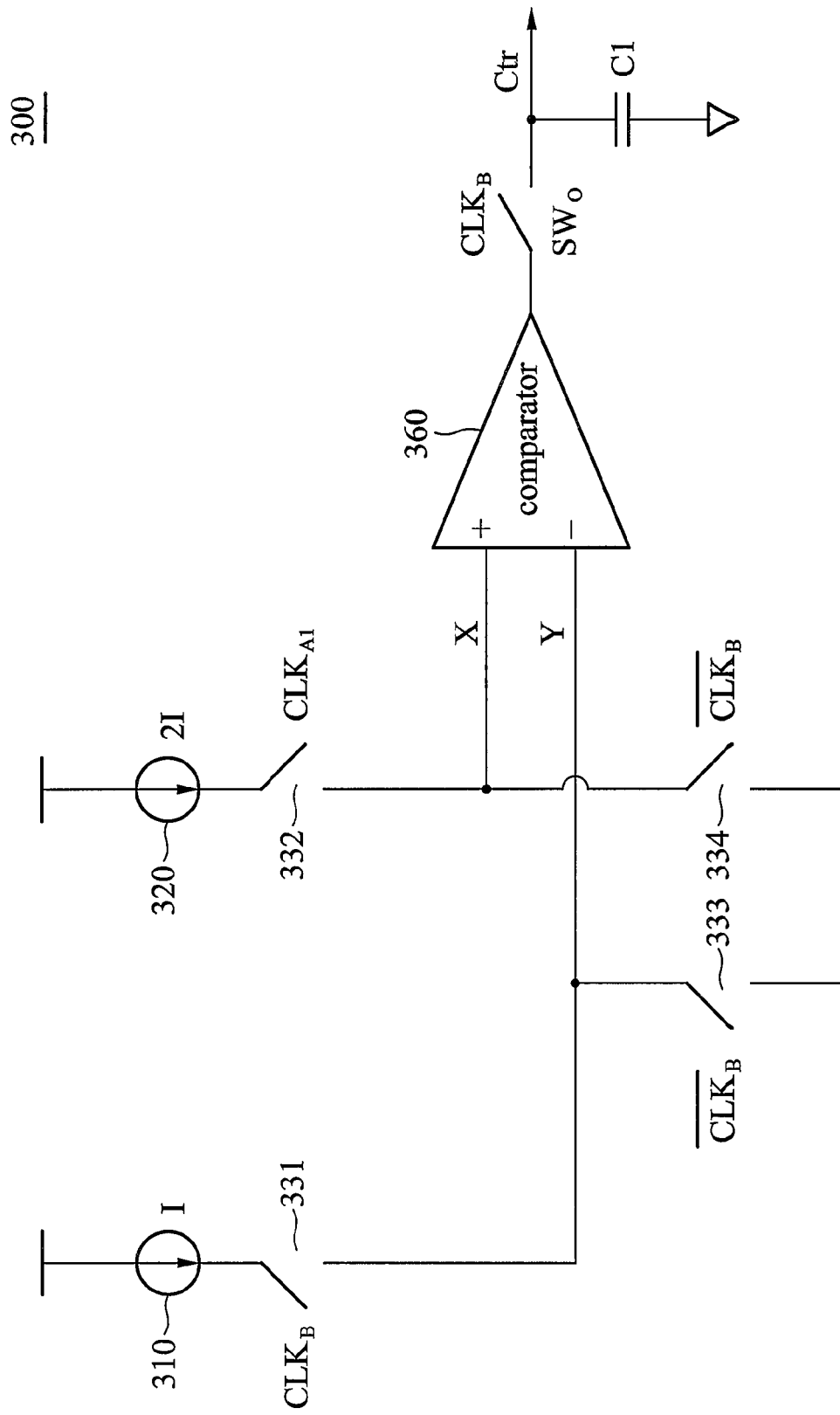
FIG. 3 is a schematic diagram of a duty cycle detector according to an embodiment of the invention.

FIG. 3 is a schematic diagram of duty cycle detector 300 according to an embodiment of the invention. Duty cycle detector 300 comprises current sources 310 and 320, switches $SW_0$, 331, 332, 333 and 334, capacitor C1 and comparator 360. Current sources 310 and 320 are fixed current sources, current source 310 generates current I and current source 320 generates current 2I. Switch 331 is coupled to fixed current source 310 and turned on or off according to clock signal $CLK_B$. Switch 332 is coupled to fixed current source 320 and turned on or off according to correction clock signal $CLK_{A1}$. Switch 333 is coupled between switch 331 and ground and turned on or off according to inverting clock signal $/CLK_B$. Switch 334 is coupled between switch 332 and ground and turned on or off according to inverting clock signal $/CLK_B$. Comparator 360 receives first current I and second current 2I and respectively converts the currents (I & 2I) to voltage signals X and Y. Comparator 360 compare voltage signals X and Y to generate control signal Ctr. Switch $SW_0$ is coupled to comparator 360 and turned on or off according to clock signal $CLK_B$. When clock signal $CLK_B$ is 1 (high voltage level), switch $SW_0$ is turned on and clock signal $CLK_B$ is 0 (low voltage level), switch $SW_0$ is turned off. According to an embodiment of the invention, comparator 360 can be composed of OP amplifiers and capacitors.

When the duty cycle of clock signal CLKA is less than 50%, comparator 360 generates negative voltage control signal Ctr to delay circuit 400 and delay circuit 400 increases a delay time of a falling edge of clock signal $CLK_A$ to generate correction clock signal $CLK_{A1}$. When the duty cycle of clock signal $CLK_A$ is more than 50%, comparator 360 generates positive voltage control signal Ctr to delay circuit 400 and delay circuit 400 decreases a delay time of a falling edge of clock signal $CLK_A$ to generate correction clock signal $CLK_{A1}$.

It is not limited that delay circuit 400 only adjusts a delay time of a falling edge of a clock signal. According to another embodiment of the invention, delay circuit 400 can adjust not only a falling edge but also a rising edge of clock signal $CLK_A$ according to control signal Ctr.

Figure 4:
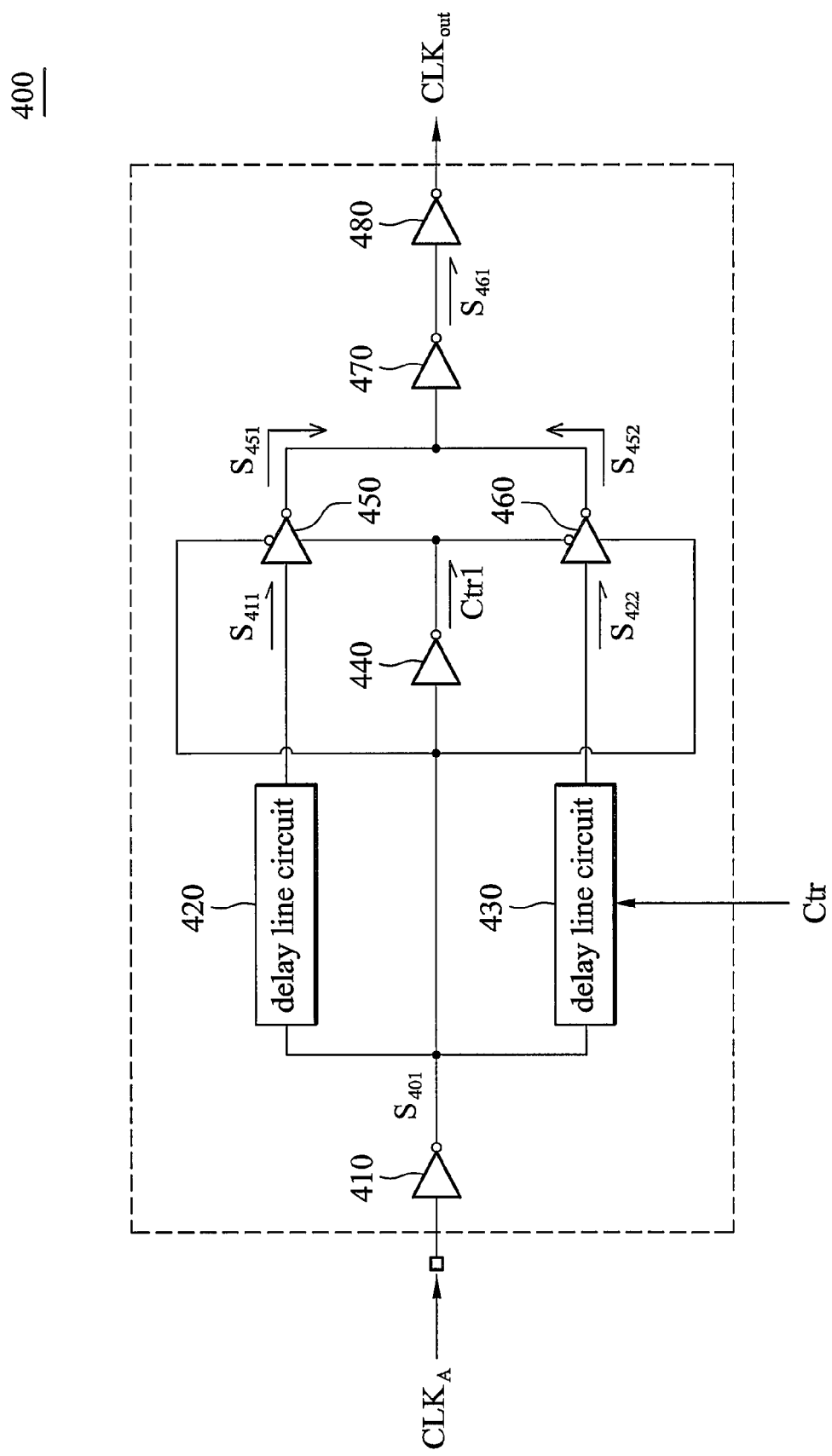
FIG. 4 is a schematic diagram of a delay circuit according to an embodiment of the invention.

FIG. 4 is a schematic diagram of delay circuit 400 according to an embodiment of the invention. Delay circuit 400 comprises inverting circuit 410, delay line circuits 420 and 430, inverter 440, tri-inverters 450 and 460 and inverting circuits 470 and 480. Inverting circuit 410 inverts clock signal $CLK_A$ to generate input signal $S_{401}$. Delay line circuit 420 receives input signal $S_{401}$ and delays input signal $S_{401}$ by a delay time $T_r$ to output delay output signal $S_{411}$. Delay line circuit 430 receives input signal $S_{401}$ and delays input signal $S_{401}$ by a delay time $T_f$ according to control signal Ctr to output delay output signal $S_{422}$. Delay time $T_r$ is a delay time of a rising time of clock signal $CLK_A$. Delay time $T_f$ is a delay time of a falling time of clock signal $CLK_A$. Inverter 440 inverts input signal $S_{401}$ to output switch control signal Ctrl. Tri-inverter 450 receives and inverts delay output signal $S_{411}$ and outputs first output signal $S_{451}$ according to switch control signal Ctrl. Tri-inverter 460 receives and inverts delay output signal $S_{422}$ and output second output signal $S_{452}$ according to switch control signal Ctrl. Inverting circuit 470 inverts first output signal $S_{451}$ or second output signal $S_{452}$ to output inverting output signal $S_{461}$. Inverting circuit 480 inverts inverting output signal $S_{461}$ to output correction clock signal $CLK_{A1}$ (output signal $CLK_{OUT}$). Delay line circuits 420 and 430 adjust delay time Tf and Tr according to control signal Ctr.

Figure 5:
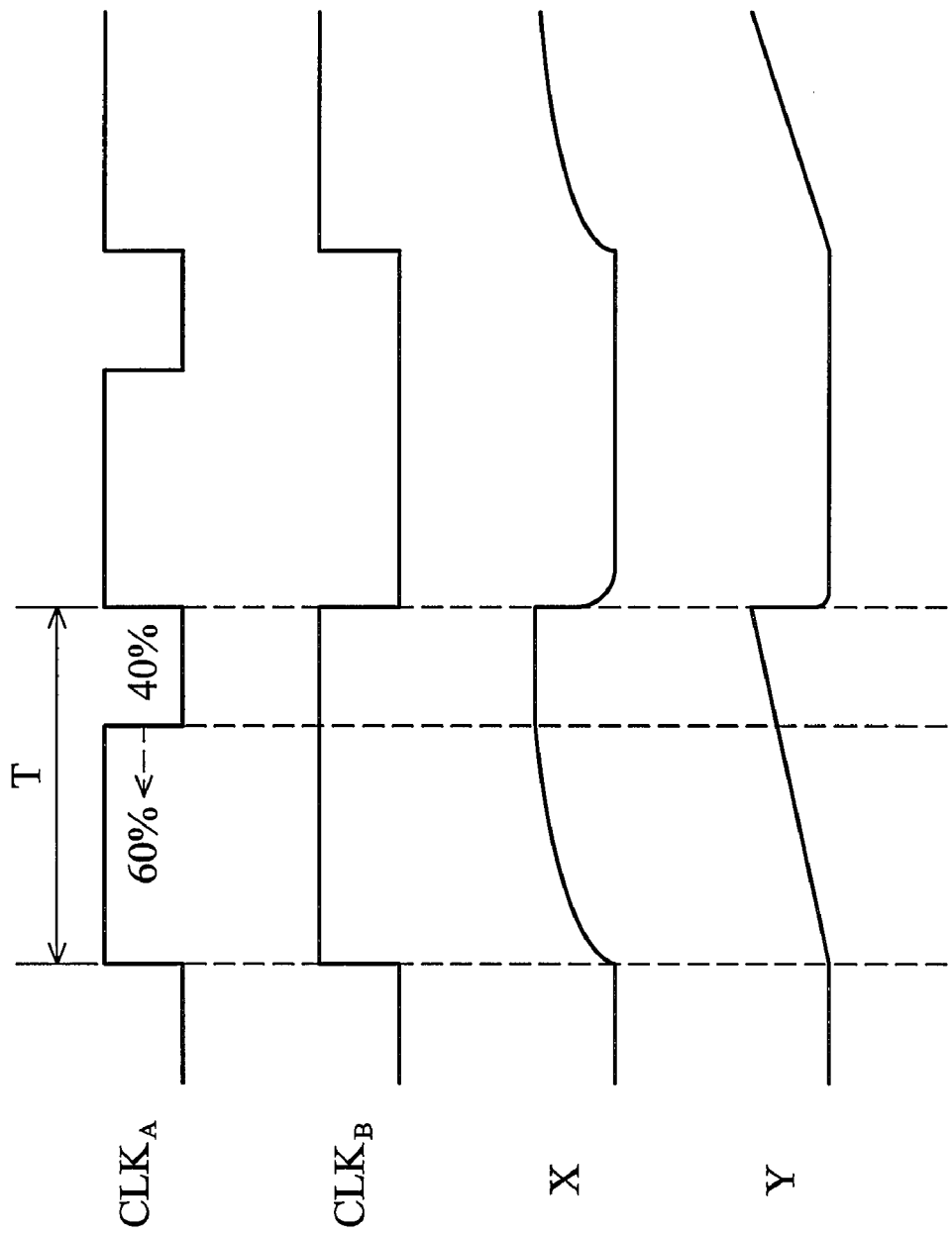
FIG. 5 is a signal diagram of two clock signals and two voltage signals according to an embodiment of the invention.

FIG. 5 is a signal diagram of clock signals $CLK_A$ and $CLK_B$ and voltage signals X and Y according to an embodiment of the invention. Referring to FIGS. 3 and 5, according to an embodiment of the invention, a duty cycle of clock signal $CLK_A$ is 60%. Due to fixed current source 320 providing current 2I and fixed current source 310 providing current I, during a charging period T, a voltage level of voltage signal X is higher than a voltage level of voltage signal Y. Comparator 360 compares voltage signals X and Y to generate a positive signal through switch $SW_0$ to charge capacitor C1 (switch $SW_0$ is turned on because clock signal $CLK_B$ is at a high voltage level). Comparator 360 generates positive control signal Ctr by using switch $SW_0$ and capacitor C1. When clock signal $CLK_B$ is at a low voltage level, delay circuit 400 decreases a delay time of a falling edge of clock signal $CLK_A$ according to positive control signal Ctr to generate correction clock signal $CLK_{A1}$ which shifted the falling edge to left.

According to another embodiment of the invention, a duty cycle of clock signal $CLK_A$ is less than 50% (clock signal $CLK_A$ is high voltage level less than 50%). After a charging period T, comparator 360 generates negative control signal Ctr to a terminal of capacitor C1. When clock signal $CLK_B$ is at a low voltage level, delay circuit 400 increases a delay time of a falling time of clock signal $CLK_A$ according to negative control signal Ctr to generate correction clock signal $CLK_{A1}$ which shifted the falling edge to right. The duty cycle of correction clock signal $CLK_{A1}$ is adjusted to 50%.

Figure 6:
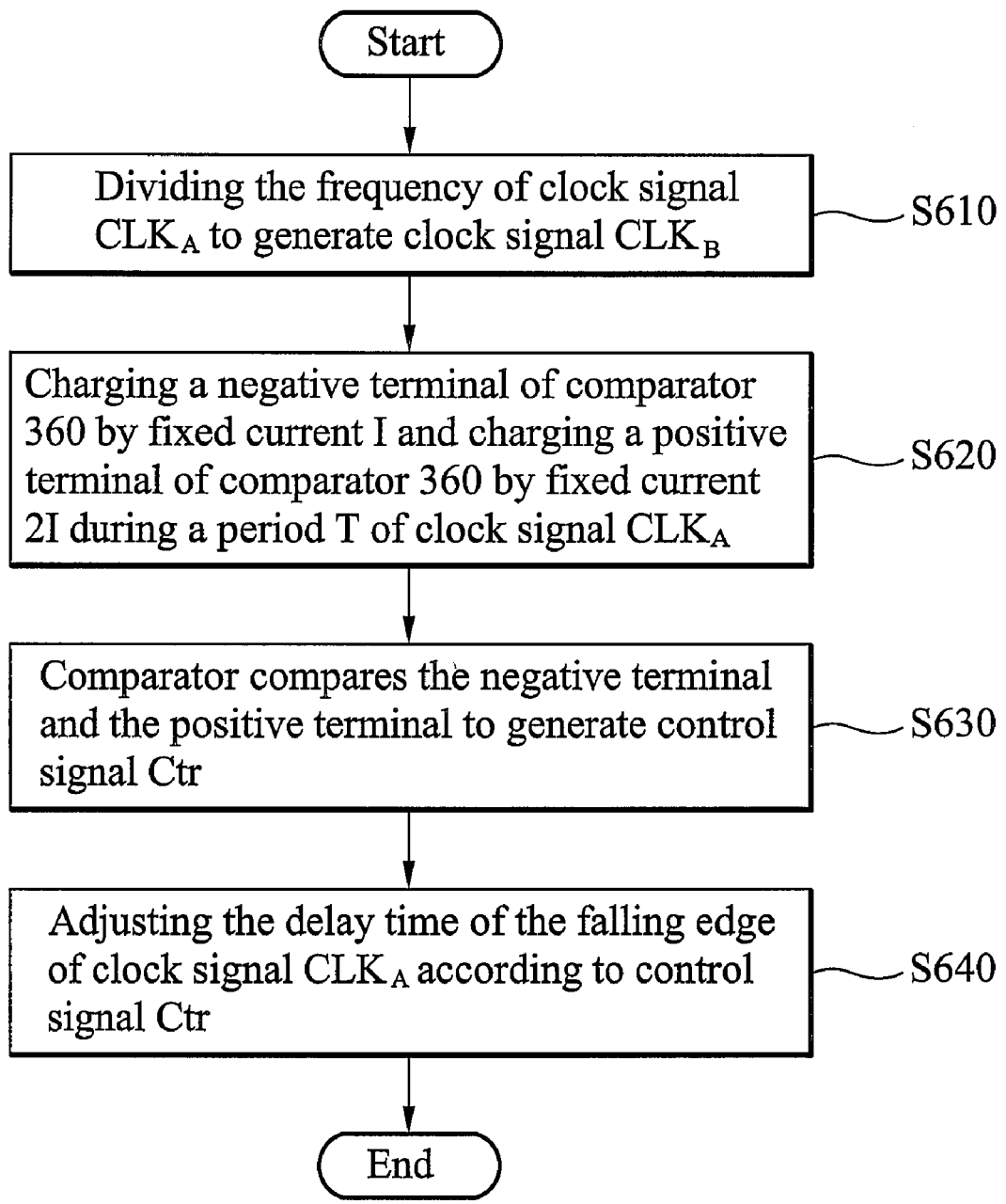
FIG. 6 is a flow chart of a duty cycle correction method according to an embodiment of the invention.

FIG. 6 is a flow chart of a duty cycle correction method according to an embodiment of the invention. First, the frequency of clock signal $CLK_A$ is divided to generate clock signal $CLK_B$ (Step S610). Next, during a period T of clock signal $CLK_A$, a negative terminal of comparator 360 is charged by fixed current I and a positive terminal of comparator 360 is charged by fixed current 2I (step S620). Comparator 360 compares voltages of the negative terminal and the positive terminal to generate control signal Ctr (step S630). Then, the delay time of the falling edge of clock signal $CLK_A$ is adjusted according to control signal Ctr. (step S640). According to another embodiment of the invention, control signal Ctr can adjust the delay time of the rising edge of clock signal $CLK_A$.

While the invention has been described by way of example and in terms of preferred embodiment, it is to be understood that the invention is not limited to thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A duty cycle correction circuit, comprising
    a frequency divider receiving a first clock signal and dividing frequency of the first clock signal to generate a second clock signal;
    a duty cycle detector receiving the second clock signal and a correction clock signal and generating a control signal according to the second clock signal and the correction clock signal, wherein the duty cycle detector comprises:
        a first fixed current source generating a first current;
        a second fixed current source generating a second current, wherein the second current is double the first current;
        a first switch coupled to the first fixed current source and turned on or off according to the second clock signal;
        a second switch coupled to the second fixed current source and turned on or off according to the correction clock signal;
        a third switch coupled between the first switch and a ground and turned on or off according to an inverting correction clock signal;
        a fourth switch coupled between the second switch and the ground and turned on or off according to the inverting correction clock signal; and
        a comparator receiving the first current and the second current, respectively converting the first current and the second current to a first voltage and a second voltage, and comparing the first voltage and the second voltage to generate an output signal through a fifth switch to charge a capacitor to generate the control signal; and
    a delay circuit receiving the first clock signal and the control signal and adjusting a delay time of a falling edge of the first clock signal according to the control signal to generate the correction clock.

2. The duty cycle correction circuit as claimed in claim 1, wherein when a duty cycle of the first clock signal is less than 50%, the delay circuit increases the delay time of the falling edge of the first clock signal, and when the duty cycle of the falling edge of the first clock signal is more than 50%, the delay circuit decreases the delay time of the falling edge of the first clock signal.

3. The duty cycle correction circuit as claimed in claim 1, wherein the frequency divider generates the second clock signal according to a rising edge of the first clock signal.

4. The duty cycle correction circuit as claimed in claim 1, wherein when a duty cycle of the first clock signal is less than 50%, the comparator generates the negative control signal to the delay circuit and the delay circuit increases the delay time of the falling edge of the first clock signal.

5. The duty cycle correction circuit as claimed in claim 1, wherein when a duty cycle of the first clock signal is more than 50%, the comparator generates the positive control signal to the delay circuit and the delay circuit decreases the delay time of the falling edge of the first clock signal.

6. The duty cycle correction circuit as claimed in claim 1, wherein the delay circuit further adjusts delay times of a rising edge and the falling edge of the first clock signal according to the control signal.

7. The duty cycle correction circuit as claimed in claim 1, wherein the inverting correction clock signal and the correction clock signal are complementary with respect to each other.

8. The duty cycle correction circuit as claimed in claim 1, wherein the delay circuit comprises:
- an inverting circuit inverting the first clock signal to generate a first output signal;
- a first delay line circuit receiving the first output signal and delaying the first output signal by a first delay time to output a first delay output signal;
- a second delay line circuit receiving the first output signal and delaying the first input signal by a second delay time according to the control signal to output a second delay output signal;
- an inverter inverting the first input signal to output a switch control signal;
- a first tri-inverter receiving the first delay output signal and outputting a first output signal according to the switch control signal;
- a second tri-inverter receiving the second delay output signal and outputting a second output signal according to the switch control signal;
- a first inverting circuit inverting the first output signal or the second output signal to output an inverting output signal; and
- a second inverting circuit inverting the inverting output signal to output the correction clock signal.

9. A duty cycle correction method, comprising:
- dividing a frequency of a first clock signal to generate a second clock signal;
- charging a first terminal of a comparator by a first fixed current during a period of the first clock signal;
- charging a second terminal of the comparator by a second fixed current during the period of the first clock signal;
- comparing voltages of the first terminal and the second terminal of the comparator to generate a control signal; and
- adjusting a delay time of a falling edge of the first clock signal according to the control signal.

10. The duty cycle correction method as claimed in claim 9, wherein the frequency of the first clock signal is divided by two to generate the second clock signal.

11. The duty cycle correction method as claimed in claim 9, wherein the second fixed current is double the first fixed current.

12. The duty cycle correction method as claimed in claim 9, wherein when a duty cycle of the first clock signal is less than 50%, the comparator generates a negative control signal to a delay circuit and the delay circuit increases the delay time of the falling edge of the first clock signal.

13. The duty cycle correction method as claimed in claim 9, wherein when the duty cycle of the first clock signal is more than 50%, the comparator generates a positive control signal to a delay circuit and the delay circuit decreases the delay time of the falling edge of the first clock signal.

14. A duty cycle correction circuit, comprising
- a frequency divider receiving a first clock signal and dividing frequency of the first clock signal to generate a second clock signal;
- a duty cycle detector receiving the second clock signal and a correction clock signal and generating a control signal according to the second clock signal and the correction clock signal; and
- a delay circuit receiving the first clock signal and the control signal and adjusting a delay time of a falling edge of the first clock signal according to the control signal to generate the correction clock, wherein the delay circuit comprises:
  - an inverting circuit inverting the first clock signal to generate a first output signal;
  - a first delay line circuit receiving the first output signal and delaying the first output signal by a first delay time to output a first delay output signal;
  - a second delay line circuit receiving the first output signal and delaying the first input signal by a second delay time according to the control signal to output a second delay output signal;
  - an inverter inverting the first input signal to output a switch control signal;
  - a first tri-inverter receiving the first delay output signal and outputting a first output signal according to the switch control signal;
  - a second tri-inverter receiving the second delay output signal and outputting a second output signal according to the switch control signal;
  - a first inverting circuit inverting the first output signal or the second output signal to output an inverting output signal; and
  - a second inverting circuit inverting the inverting output signal to output the correction clock signal.

* * * * *